United States Patent [19]

Petersson

[11] Patent Number: 5,142,246

[45] Date of Patent: Aug. 25, 1992

[54] MULTI-LOOP CONTROLLED VCO

[75] Inventor: Peter M. Petersson, Järfälla, Sweden

[73] Assignee: Telefonaktiebolaget L M Ericsson, Stockholm, Sweden

[21] Appl. No.: 717,660

[22] Filed: Jun. 19, 1991

[51] Int. Cl.⁵ .................................. H03L 7/00
[52] U.S. Cl. .................................. 331/11; 331/25
[58] Field of Search .................. 331/10, 11, 17, 25

[56] References Cited

U.S. PATENT DOCUMENTS

| | | |
|---|---|---|
| 3,032,720 | 5/1962 | Bruch et al. . |
| 3,862,365 | 1/1975 | Kobayashi et al. . |
| 3,909,735 | 9/1975 | Anderson et al. ............... 331/10 |
| 4,077,015 | 2/1978 | Carson et al. . |
| 4,129,886 | 12/1978 | Shih . |
| 4,131,862 | 12/1978 | Black et al. . |
| 4,186,343 | 1/1980 | Kakigi . |
| 4,200,845 | 4/1980 | Mendenhall et al. . |
| 4,243,941 | 1/1981 | Zdunek . |
| 4,322,643 | 3/1982 | Preslar ............................... 307/528 |
| 4,365,211 | 12/1982 | Lee . |
| 4,403,342 | 9/1983 | Borras et al. . |
| 4,472,820 | 9/1984 | Borras . |
| 4,494,090 | 1/1985 | Popek et al. . |
| 4,516,083 | 5/1985 | Turney . |
| 4,546,329 | 10/1985 | Unger . |
| 4,562,411 | 12/1985 | O'Rourke et al. . |
| 4,580,107 | 4/1986 | Caldwell et al. . |
| 4,587,496 | 5/1986 | Wolaver . |
| 4,639,688 | 1/1987 | Hopwood et al. . |
| 4,724,437 | 2/1988 | Jones et al. . |
| 4,771,249 | 9/1988 | Burch et al. . |
| 4,827,225 | 5/1989 | Lee . |
| 4,855,689 | 8/1989 | Kinkel . |
| 4,868,513 | 9/1989 | Piercy et al. . |
| 4,885,553 | 12/1989 | Hietala et al. .................... 331/17 |
| 4,920,320 | 4/1990 | Matthews . |
| 4,928,075 | 5/1990 | Leis . |
| 4,937,536 | 6/1990 | Reinhardt et al. . |
| 4,940,950 | 7/1990 | Helfrick . |
| 4,942,370 | 7/1990 | Shigemori . |

Primary Examiner—Robert J. Pascal
Attorney, Agent, or Firm—Burns, Doane, Swecker & Mathis

[57] ABSTRACT

Separate phase (or frequency/phase) detectors are used in separate feedback loops of a phase-locked loop, one of the detectors having a dead zone and the other detector having no dead zone. The dead zone of the one detector, rather than being regarded as undesirable as in the prior art, is used to gradually shift the effective loop bandwidth of the phase-locked loop from a wide bandwidth to a narrow bandwidth without requiring any deliberate control action or switching circuitry.

14 Claims, 5 Drawing Sheets

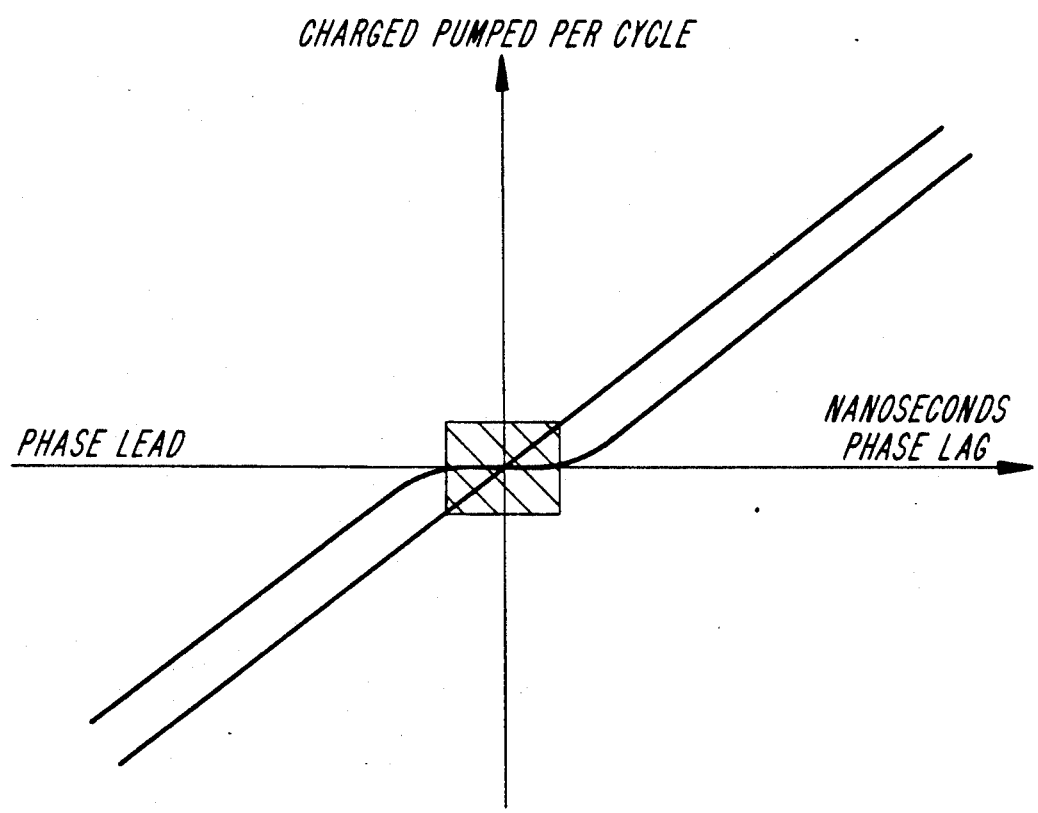

MULTI-LOOP CONTROLLED VCO

FIELD OF THE INVENTION

The present invention relates to phase-locked loops (PLLs) and more particularly to a phase-locked loop having two independent loops of different bandwidths wherein the overall loop bandwidth of the phase-locked loop is gradually and automatically changed.

BACKGROUND OF THE INVENTION

A phase-locked loop may be represented as a combination of three basic components: a phase detector, a loop filter and a voltage-controlled oscillator (VCO), the loop filter being connected to the output signal of the phase detector and the control input of the VCO. The phase detector compares the phase of a periodic input signal or reference frequency against the phase of the signal produced by the VCO. The difference voltage signal generated by the phase detector is a measure of the phase difference between the two input signals. The difference voltage signal is filtered by the loop filter to produce a control voltage which is then applied to the VCO. Application of the control voltage to the VCO changes the frequency of an output signal produced by the VCO in a direction that reduces the phase difference between the input signal and the reference source.

One well-known type of phase detector uses interconnected digital logic gates to detect whether the phase of the VCO output signal leads or lags that of the reference signal. The voltage used to control the VCO is produced by integrating the current at a circuit node, that current being supplied by a charge pump (a paired current source and current sink) precisely controlled by the phase detector. When the phase detector detects that the phase of the output signals leads that of the reference signal, the charge pump is controlled to withdraw current from the node, reducing the control voltage and retarding the phase of the output signal. When the phase detector detects that the phase of the output signal lags that of the reference signal, the charge pump is controlled to inject current into the node, increasing the control voltage and advancing the phase of the output signal.

Historically, such phase detectors have suffered from the occurrence of a "dead zone" in their operating response, i.e., a range of phase differences in response to which the phase detector does not produce any output signal. The dead zone occurs for very small phase differences as a result of the charge pump not being activated for a sufficient time to appreciably influence the integrated output of the detector.

Before phase-lock can be attained, frequency lock must first be achieved, since signals of different frequencies by definition cannot (except instantaneously) be in phase. Frequency variation of either the reference signal or the output signal produces a phase error such that the loop is no longer phase-locked.

As the loop frequency naturally and unavoidably drifts from the reference frequency, the loop feedback mechanism cannot correct for the drift until the phase error becomes large enough to extend past the dead zone. As a result, the dead zone permits random frequency modulation as the loop frequency varies and phase error wanders from one end of the dead zone to the other, degrading the accuracy and spectral purity of the output signal. Techniques have been developed to eliminate the troublesome dead zone problem. Once such technique is described, for example, in U.S. Pat. No. 4,322,643 to Preslar, which is incorporated herein by reference.

Phase-locked loops are widely used in frequency synthesis to produce an output signal of a frequency that is a multiple of an input frequency. An ideal phase-locked loop would lock-in quickly to a particular frequency within a wide frequency range and, once locked, would not be easily untracked by noise perturbations of the reference signal. In practice, however, such performance criteria are often in conflict. For example, to realize fast lock-in, it is desirable to have a wide overall loop bandwidth. In order to prevent signal leakage from the reference oscillator and other disturbances from being input to the VCO and causing unwanted frequency component in the output signal, however, a narrow overall loop bandwidth is desirable.

The prior art provides various techniques for changing the loop bandwidth of a phase-locked loop according to operating conditions from a more acquisition-optimal bandwidth to a more tracking-optimal bandwidth. An example of such a technique is found in U.S. Pat. No. 3,909,735 to Anderson et al, incorporated herein by reference. In that patent, the output signals of a narrow band loop filter and a wide band loop filter are combined to form the control input to a voltage controlled oscillator (VCO). The output signal of the wide band loop filter is gradually attenuated by a switch control circuit during the progression of the phase-lock process. When final lock is achieved, the output signal of the wide loop filter is fully attenuated.

In such an arrangement, however, switching between different filters often causes disturbing transients which prolong the lock-in time. In addition, the timing of the switching operation may be difficult to choose and control.

What is needed is a phase-locked loop that acquires phase lock quickly but is not easily susceptible to noise perturbations and reference leakage that cause undesired spectral components in the VCO output signal. More particularly, what is needed is a phase-locked loop whose loop characteristics inherently realize the foregoing performance objectives without switching components into or out of the loops or requiring any other deliberate control operation.

SUMMARY OF THE INVENTION

In the present invention, separate phase (or frequency/phase) detectors are used in separate feedback loops, one of the detectors having a dead zone and the other detector having no dead zone. The dead zone of the one detector, rather than being a source of trouble as typically regarded in the prior art, is used to gradually shift the effective loop bandwidth of the phase-locked loop from a wide bandwidth to a narrow bandwidth without requiring any deliberate control action or switching circuitry.

Broadly, according to the present invention, a phase-locked loop is provided with independent control loops. One of the control loops includes a phase (or frequency/phase) detector having a dead zone and another of the control loops includes a phase detector having no dead zone. Preferably, the control loop including a phase detector having a dead zone encompasses a wider bandwidth than the control loop including a detector having no dead zone. As phase-lock progresses, the phase error is reduced and eventually approaches the dead zone of the wide bandwidth loop. Accordingly, the influence of that loop progressively decreases until only the narrow bandwidth loop is effective to influence the output of the phase-locked loop. The shift in control of the VCO/PLL by the wide bandwidth loop to control by the narrow bandwidth loop is gradual and automatic. Moreover, the shift does not require phase-lock detection or a mechanism for deliberately switching between the wide band and narrow band loops.

Also according to the present invention, a first phase detector having a dead zone compares a reference signal and the output signal of a variable-frequency oscillator and a second phase detector having no dead zone compares the reference signal and the output signal of the oscillator. A first filter is responsive to an output signal of the first detector for governing a response of the oscillator in a first range by producing a first control input and a second filter is responsive to an output signal of the second detector for governing a response of the oscillator in a second range by producing a second control input.

BRIEF DESCRIPTION OF THE DRAWINGS

These and other features and advantages of the invention will be readily apparent to one of ordinary skill in the art from the following written description, read in conjunction with the drawings, in which:

FIG. 6 is a graph representing the response of a combination of phase detectors according to the present invention.

DETAILED DESCRIPTION OF THE PREFERRED EMBODIMENTS

Figure 1:
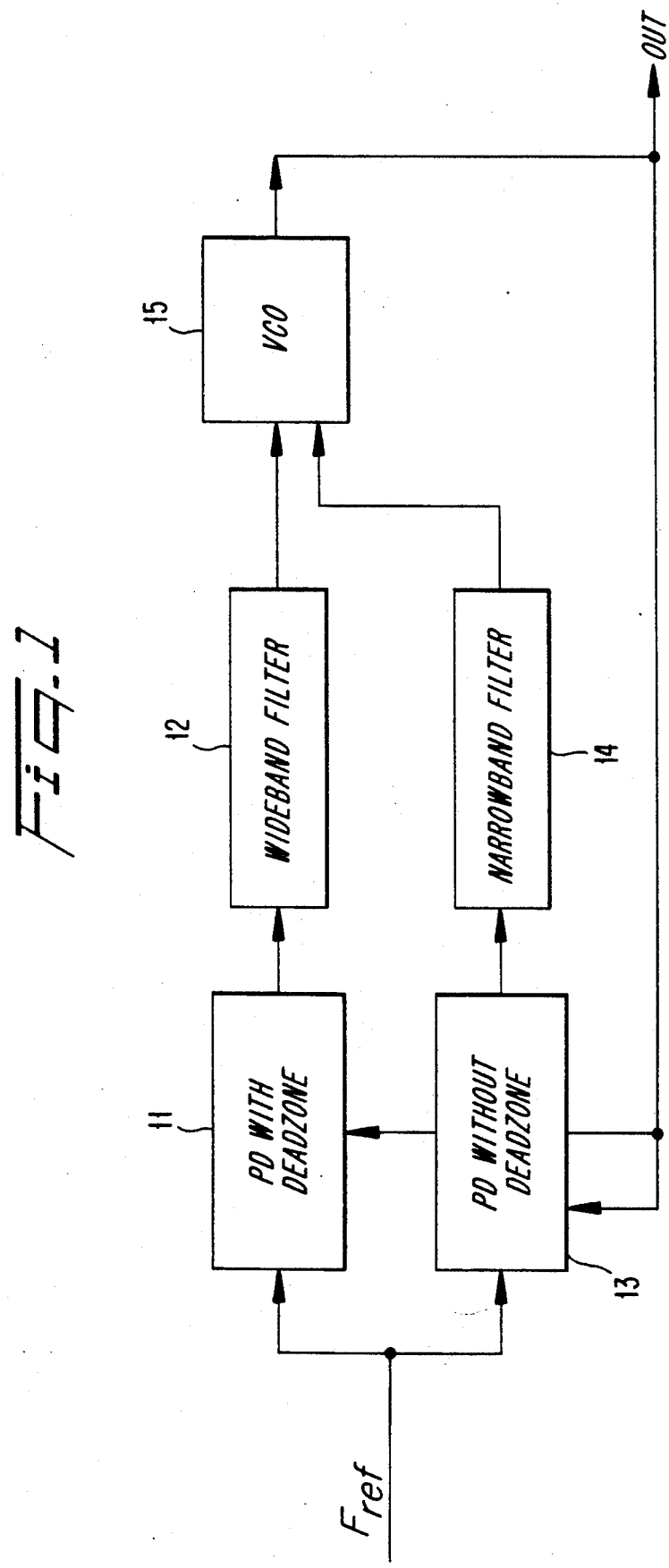
FIG. 1 is a block diagram of an embodiment of the present invention.

Referring now to FIG. 1, the phase-locked loop in one embodiment of the present invention is provided with two independent control loops. One of the loops has a frequency/phase detector 11 with a dead zone and a wide band filter 12 and the other loop has a frequency/phase detector 13 without any dead zone and a narrow band filter 14. A reference frequency $F_{ref}$ and a VCO output signal OUT are received by each of the phase detectors, and the output signals of the different bandwidth filters are input to two separate control inputs of the VCO 15. Alternatively, the output signals of the filters may be summed and input as a single control input of the VCO 15. Since the control loops are independent, their respective filters may be independently optimized. Using the detector with a dead zone feeding an optimum wide band filter, phase-lock is rapidly approached, resulting in a phase error not exceeding the size of the dead zone. As the dead zone is entered, this detector no longer effects control of the VCO. At that point, because the smallness of the phase error is such as to not trigger any response from the detector, the other detector not having a dead zone, in cooperation with its associated narrow band filter, solely determines the output signal of the VCO. Both loops operate together with the influence of the wide band loop initially controlling the VCO operation and the influence of the narrow band loop increasing as the dead zone of the wide band loop is approached. The transition to the dead zone of the one detector is not sudden but gradual. Accordingly, the lock-in process is performed smoothly and automatically with a uniformly decreasing loop bandwidth until zero phase error is achieved.

In designing the respective filters, the wide band filter should have a bandwidth wide enough to make the PLL rapidly approach the dead zone (very small phase error) taking into account frequency switching time, range of frequency change, and the size of the dead zone. The narrow band filter should sufficiently attenuate reference signal leakage from the phase detector taking into account frequency switching time. Normally, both closed loops will be critically damped, corresponding to a damping factor of about 0.7.

The rapid frequency lock-in of the phase-locked loop of FIG. 1 may be used to advantage in a cellular mobile radiotelephone system. In such a system, communications in a geographical area divided into contiguous cells are carried out between base stations each serving a cell and mobile stations within the respective cells. As mobile stations move from cell to cell, hand-off of a call from one base station using a particular frequency to another base station using a different frequency becomes necessary. To avoid call interruption the mobile station must be able to change frequency quickly. A series of channel frequencies related to a reference frequency may be obtained by providing a variable frequency divider 16 in the PLL feedback loop as illustrated in FIG. 2.

The VCO output signal is set to a frequency of N times the reference frequency, N being a variable integer. The divisor of the frequency divider 15, which becomes the multiple of the reference frequency, is provided by a channel selection signal in the mobile station. The channel selection signal may also be used to realize a pretuning feature where the lock-in time of the phase-locked loop may be further reduced. For example, a channel number may be converted to a proportional analog voltage in a pretune block 17 for input to the VCO such that the VCO operates at the same approximate frequency as the selected channel. To eliminate the risk of disturbances, the pretune voltage may be filtered if required. More sophisticated pretune arrangements may also be used. For example, the exact VCO input (i.e., the sum of all control voltages) for a certain frequency may be measured when the loop is locked and stored in a memory for use later as the pretune voltage.

Figure 2:
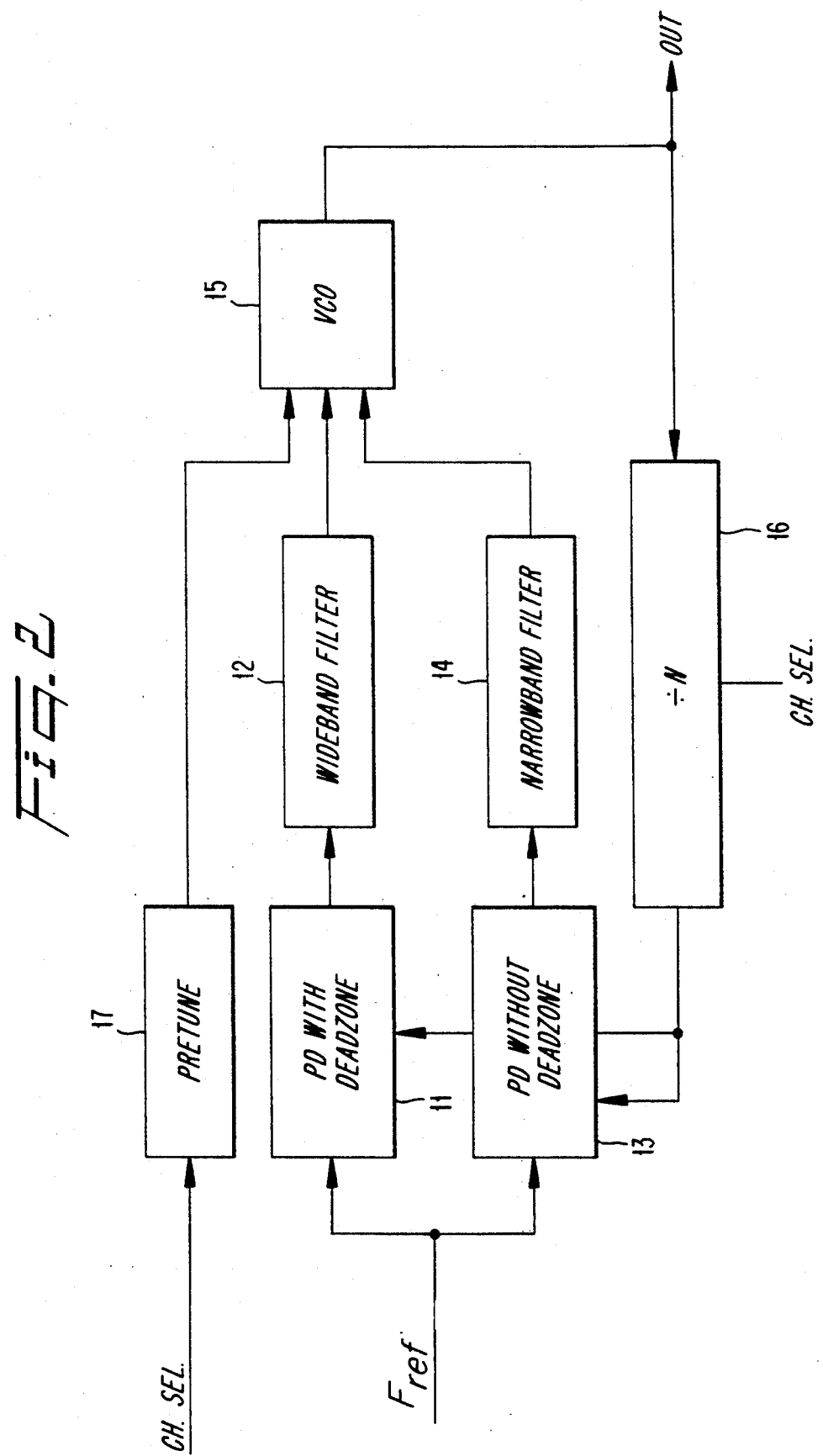
FIG. 2 is a block diagram of another embodiment of the present invention.
Figure 3:
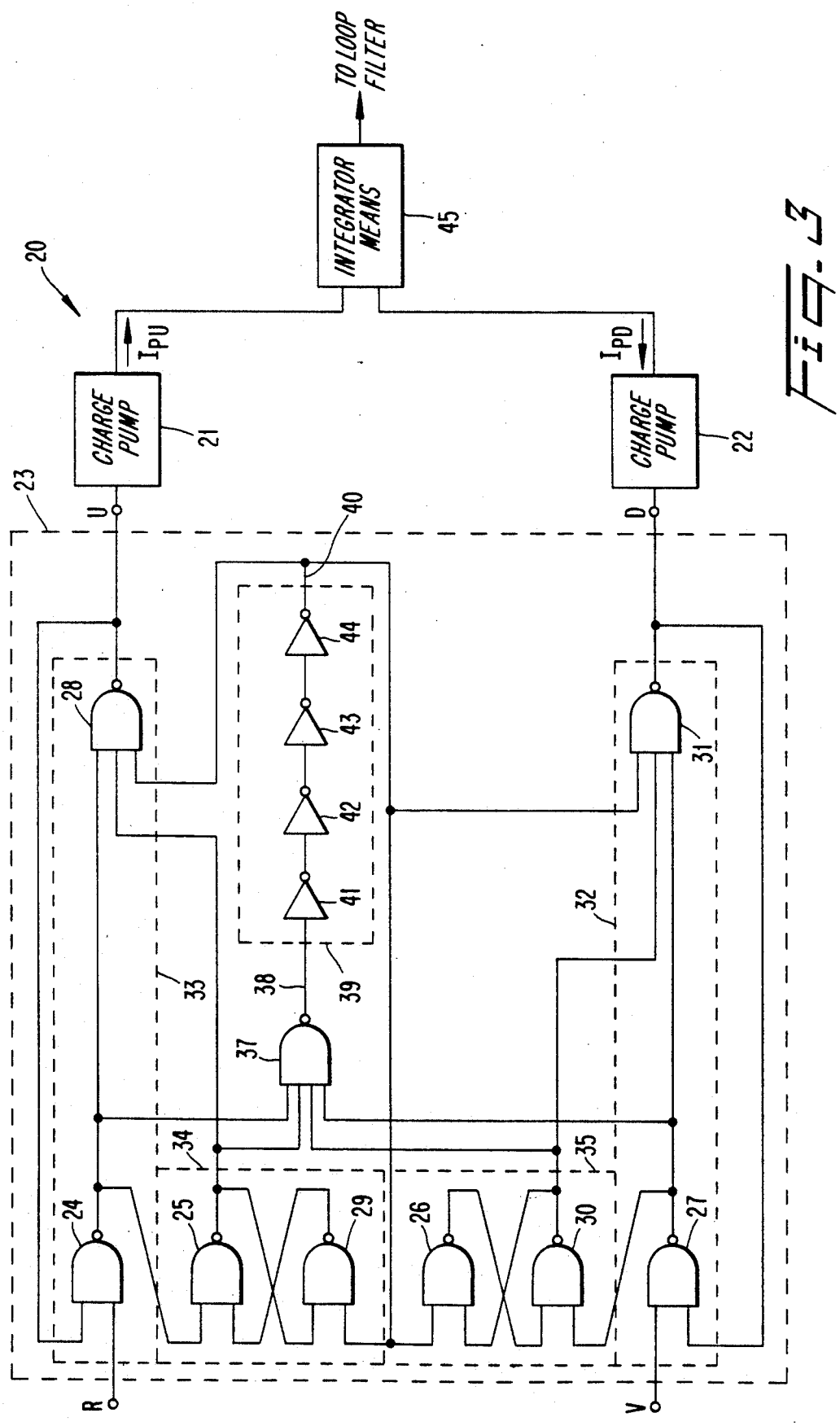
FIG. 3 is a schematic diagram of a phase detector which may be used in implementing the present invention.

The frequency/phase detectors of FIGS. 1 and 2 may be embodied according to a known construction illustrated in FIG. 3. The frequency/phase detector 20 has as its two inputs the reference signal, to be input at the terminal designated R, and the generated signal from either the VCO or the frequency divider, to be input at the terminal designated V. Depending on the frequency and phase relationship of the two inputs, the frequency/phase detector generates a signal at an up terminal U if the generated signal lags the reference signal and a down signal at a terminal D if the generated signal leads the reference signal. The U and D signals are input to an up charge pump 21 and a down charge pump 22 respectively to generate one (or possibly both) of a pump-up current $I_{PU}$ and a pump-down current $I_{PD}$. The sum of these two currents is integrated over time in an integrator means 45, the output of which is fed to a loop filter.

The logic portion 23 of the frequency/phase detector 20 implements a digital tri-state detector of a type well-known in the art. NAND gates 24, 25, 26 and 27 are cross-coupled with NAND gates 28, 29, 30 and 31 to form four flip-flops 32, 33, 34, and 35, the outputs of which are fed to a four-input NAND gate 37. When all of the flip-flops are set, the output 38 of NAND gate 37 is activated.

The output signal of the NAND gate 37 is propagated through a delay element 39, if present, and appears some time later at the output terminal 40 of the delay means. In response to the signal at output terminal 40, the flip-flops 32, 33, 34, and 35 are reset. By including a delay element 39, in this instance a chain of invertors 41-44, in the detector circuitry, the frequency/phase detector does not exhibit a dead zone. Without the delay element, the frequency/phase detector does have a dead zone. The delay element 40 may also be realized by other than a chain of invertors, for example by an RC network or other convenient delay means.

Since frequency/phase detectors of the present type are well-known in the art, no further explanation of the same will be offered here.

Figure 4:
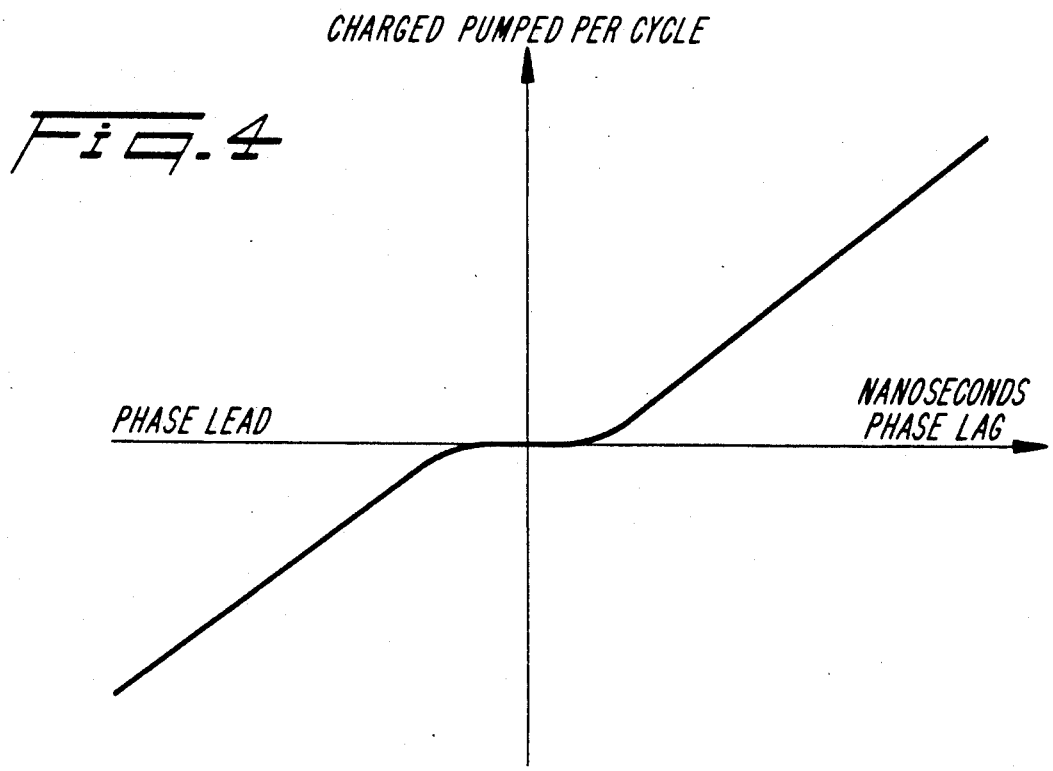
FIG. 4 is a graph representing the response of a phase detector having a dead zone.

Without the delay element 40, the frequency/phase detector of FIG. 3 exhibits a dead zone characteristic as shown in FIG. 4. When the phase error is very small, the U and D pulses may be so narrow as to have no appreciable effect on the charge pump output, resulting in a dead zone in the response characteristic of the detector. Since the charge pump has a certain minimum turn-on time, in the case of an extremely narrow input pulse, the charge pump is immediately turned off before it has had a chance to begin working.

Figure 5:
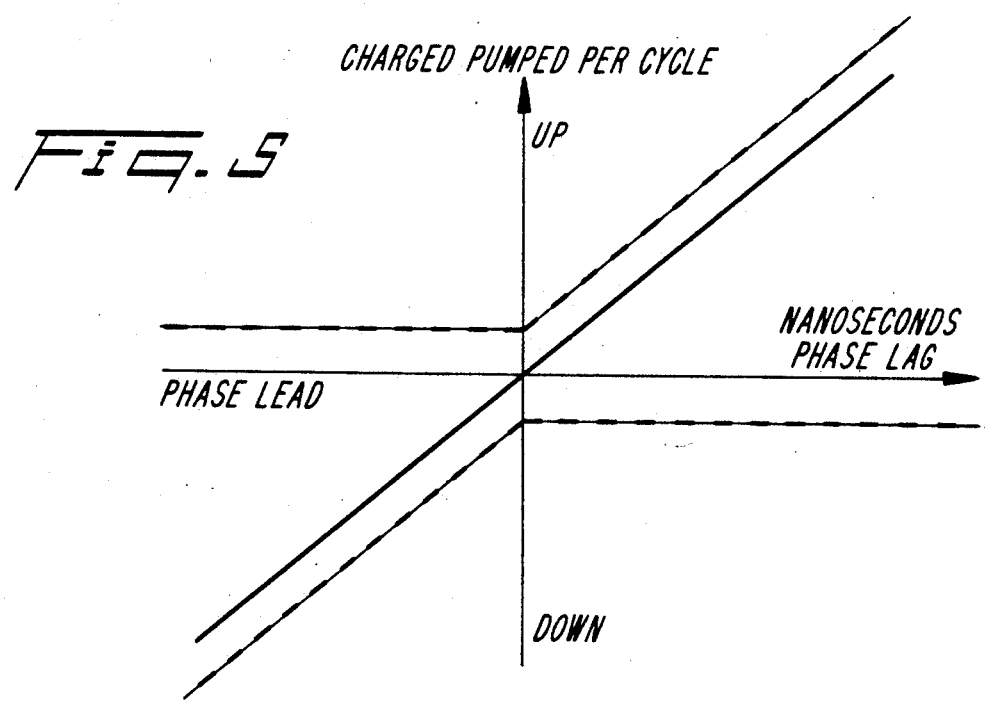
FIG. 5 is a graph representing the response of a phase detector having no dead zone.

The frequency/phase detector with the delay element 40 exhibits a characteristic as shown in FIG. 5. As seen in that figure, both the up and down charge pumps are always turned on, obviating the problem of a minimum turn-on time. At zero phase delay, however, the up and down currents effectively offset one another such that the combined resultant characteristic exhibits a nearly ideal linear response passing through the origin.

The response of the two frequency/phase comparators of the present invention, one having a dead zone and one having no dead zone, may be characterized by the superposition of their separate responses as shown in FIG. 6. Note that in the shaded area encompassing the zone of small phase error, only one of the frequency/phase detectors is active. By combining this frequency/phase detector having no dead zone in an independent control loop with a suitably optimized narrow band filter, the phase-locked loop will exhibit good tracking characteristics. Outside the shaded area in the zone of larger phase error, the other loop including the frequency/phase comparator having a dead zone and a separately optimized wide band filter enables rapid lock-in.

It will be appreciated by those of ordinary skill in the art that the present invention can be embodied in other specific forms without departing from the spirit or essential character thereof. For example, other types of frequency/phase comparators may be used as well as other methods of causing such detectors to have or not have a dead zone.

The presently disclosed embodiments are considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A phase-locked loop comprising multiple independent control loops, one of said control loops exhibiting a dead zone including a detector having a dead zone and a relatively wide band filter and another of said control loops exhibiting no dead zone including a detector having no dead zone and a relatively narrow band filter.

2. The phase-locked loop of claim 1, wherein said detectors are frequency/phase detectors.

3. The phase-locked loop of claim 2, wherein said frequency/phase detectors each include charge pump means.

4. An apparatus comprising:
a variable-frequency oscillator;
a first detector having a dead zone for comparing a reference signal and an output signal of said oscillator;
a second detector having no dead zone for comparing the reference signal and said output signal of said oscillator;
first filter means responsive to an output of said first detector for governing a response of said oscillator in a first range by producing a first control input; and
second filter means responsive to an output of said second detector for governing a response of said oscillator in a second range by producing a second control input.

5. The apparatus of claim 4, wherein said first filter means filters a relatively wide frequency band and said second filter means filters a relatively narrow frequency band.

6. The apparatus of claim 5, wherein one of said detectors is a frequency/phase detector.

7. The apparatus of claim 6, wherein one of said detectors is a digital, tri-state frequency/phase comparator.

8. An apparatus including a variable-frequency oscillator connected in a closed loop, the apparatus comprising:
a relatively wide band control loop including said variable-frequency oscillator and comparator means for comparing a reference signal and an output signal of said variable-frequency oscillator;
a relatively narrow band control loop including said variable-frequency oscillator and comparator means for comparing the reference signal and an output signal of said variable-frequency oscillator; and
means for automatically and gradually diminishing the influence of said relatively wide band control loop on said variable-frequency oscillator.

9. The apparatus of claim 8, wherein said comparator means compares at least the frequency of said reference signal and said output signal.

10. The apparatus of claim 9, wherein said comparator means compares the phase of said reference signal and said output signal.

11. The apparatus of claim 10, wherein said relatively wide band control loop includes a relatively wide band filter optimized to quickly reduce any difference in frequency and phase between said reference signal and said output signal by varying the frequency and phase of said variable-frequency oscillator.

12. The apparatus of claim 11, wherein said relatively narrow band control loop includes a relatively narrow band filter optimized to eliminate a remaining difference in frequency and phase between said reference signal and said output signal and to prevent noise in said reference signal from causing a difference in frequency and phase between said reference signal and said output signal to occur.

13. The apparatus of claim 12, wherein said means for diminishing is a dead zone exhibited by said comparator means included in said relatively wide band control loop, said comparator means included in said relatively narrow band control loop not exhibiting any dead zone, such that said relatively wide band filter is effective to quickly reduce said difference and only said relatively narrow band filter is effective when said difference is small so as to fall within said dead zone to eliminate a remaining difference in frequency and phase between said reference signal and said output signal.

14. The apparatus of claim 13 further comprising pretuning means for pretuning said variable-frequency oscillator to a frequency close to a desired frequency.

* * * * *